(12) United States Patent
Hoche

(10) Patent No.: US 6,452,808 B2
(45) Date of Patent: Sep. 17, 2002

(54) ELECTRONICS MODULE HAVING POWER COMPONENTS, AND A METHOD OF MANUFACTURE

(75) Inventor: Jean Hoche, Saint-Etienne-du-Rouvray (FR)

(73) Assignee: Sagem SA (FR)

( * ) Notice: Subject to any disclaimer, the term of this patent is extended or adjusted under 35 U.S.C. 154(b) by 0 days.

(21) Appl. No.: 09/757,530

(22) Filed: Jan. 11, 2001

(30) Foreign Application Priority Data

Jan. 11, 2000 (FR) .......................................... 00 00282

(51) Int. Cl.$^7$ ................................................ H05K 9/00
(52) U.S. Cl. ...................... 361/774; 361/777; 361/778; 361/772; 361/773; 438/619; 174/250; 174/260; 174/261; 257/276; 257/277; 257/690
(58) Field of Search ................................. 361/774, 720, 361/760, 753, 799, 800, 748, 777, 778, 772, 773, 805; 174/35 R, 51, 52.4, 260, 261, 250; 438/619; 257/276, 776, 691, 690; 439/507, 508, 509, 510, 514, 515, 952, 957

(56) References Cited

U.S. PATENT DOCUMENTS

| | | | |
|---|---|---|---|
| 4,617,729 A | 10/1986 | Celnik | 29/840 |
| 4,838,475 A | 6/1989 | Mullins et al. | 228/179 |
| 5,637,922 A | * 6/1997 | Fillion et al. | 257/728 |
| 5,699,235 A | 12/1997 | Tsurumiya et al. | 361/803 |
| 5,973,923 A | * 10/1999 | Jitaru | 361/704 |

FOREIGN PATENT DOCUMENTS

| | | |
|---|---|---|
| DE | 38 26 999 | 6/1989 |
| DE | 44 25 803 | 2/1995 |
| EP | 0 680 248 | 4/1995 |

* cited by examiner

Primary Examiner—David Martin
Assistant Examiner—Hung Bui
(74) Attorney, Agent, or Firm—Larson & Taylor, PLC

(57) ABSTRACT

A power electronics module has a metal substrate, a printed circuit card carried on one of the faces of the substrate, and components, at least some of which are power components, mounted on the card. The card also carries electrical interconnection tracks between the components themselves and with external power supply. Conductive bridges of a shape enabling each of them to extend over a power component mutually interconnect short segments of interconnection tracks, that carry power current.

9 Claims, 1 Drawing Sheet

ELECTRONICS MODULE HAVING POWER COMPONENTS, AND A METHOD OF MANUFACTURE

BACKGROUND OF THE INVENTION

The present invention relates to a power electronics module comprising a metal substrate, a printed circuit card carried on one of the faces of the substrate, and components, at least some of which are power components, mounted on the card which also carries electrical interconnection means between the components themselves and with an external power supply. A major, although non-exclusive, application of the invention lies in the field of automotive electronics in which certain systems incorporate components that carry high currents in operation, particularly active components such as switching transistors, and possibly also passive components such as capacitors or chokes.

The use of printed tracks on the card gives rise to considerable resistive losses because of the relatively small right cross-section of the tracks and thus of their high resistance. To limit such losses, the cards of some present-day modules are provided with a circuit constituted by bars fitted to the card. That structure, referred to as a bus bar structure, presents significant drawbacks. The design of the layout needs to be specific for each new type of module. Installation requires a high degree of planeness, which is difficult to achieve. The bars constitute a significant volume of copper.

SUMMARY OF THE INVENTION

An object of the present invention is to provide a power electronics module that satisfies practical requirements better than previously known modules, in particular in that the additional components used thereby are simple in structure and standardizable so that a new type of module does not require any complex design work.

To this end, the invention provides in particular a module wherein the interconnection means include conductive bridges of a shape enabling them to extend over a power component and mutually interconnecting short segments of interconnection tracks that carry power currents.

The bridges are advantageously staple-shaped, most or all of them having the same dimensions of length and height that are sufficient to enable each of them to straddle a power component, or at least each of the active power components that are usually identical or comparable in size. Thus most or all of the bridges can be identical and of size little greater than that of the component, thereby enabling them to be handled as thought they were components, and in particular enabling them to be put into place by automatic machines after the components have been assembled.

The ends of the bridges are generally soldered to the segments using the same method as is used to solder the components, for example reflow soldering of areas of lead-tin solder when the bridges are made of copper and possibly pre-tinned.

To reduce resistive losses and heating, the short segments can be given a cross-section that is greater than that of controlling equipotential tracks that are also printed on the card. The length of the segment will always be considerably shorter than that of the bridges.

The printed circuit can be single layer or multilayer. One of its faces, an insulating face, is bonded to the substrate. In general, the substrate is carried by a cooled wall or contains a circuit for a cooling fluid, particularly if the module is to be placed in a high-temperature environment in operation, for example in the engine compartment of a motor vehicle.

The invention also provides a method of manufacturing a module, in which:

a printed circuit card carrying equipotential tracks and segments of conductor track of section greater than that of the equipotential tracks is fixed on one face of a metal substrate;

solder or brazing areas are placed at locations of the tracks for being connected to components or to bridges of conductive metal;

the components are placed in such a manner as to enable them to be secured by soldering;

the bridges are placed at locations such that their ends bear against solder or brazing areas and the bridges interconnect said segments to one another; and the components and the bridges are fixed definitively, generally by reflow soldering.

The above characteristics and others will appear better on reading the following description of a particular embodiment given by way of non-limiting example. The description refers to the accompanying drawing.

DETAILED DESCRIPTION

Figure 1:
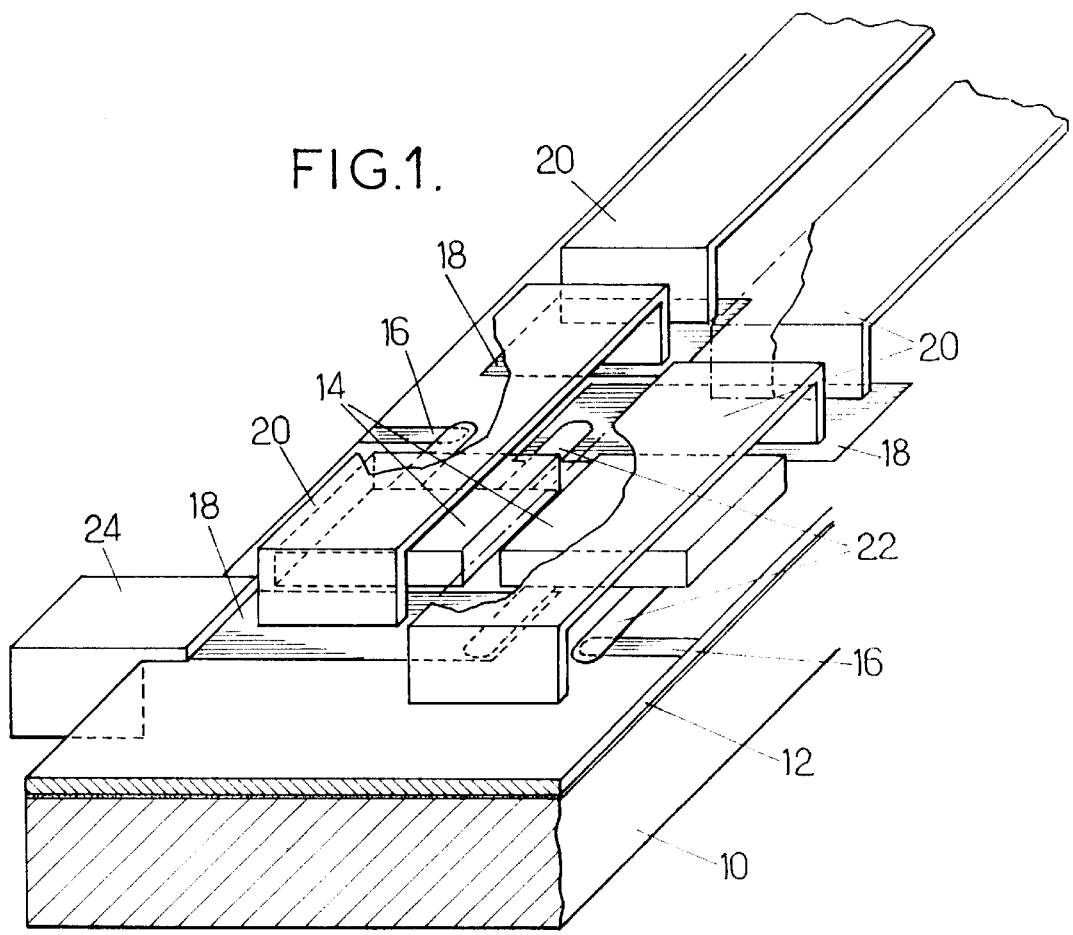
FIG. 1 is a perspective view of a fraction of a module of the invention, which is not to scale in order to improve clarity.
Figure 2:
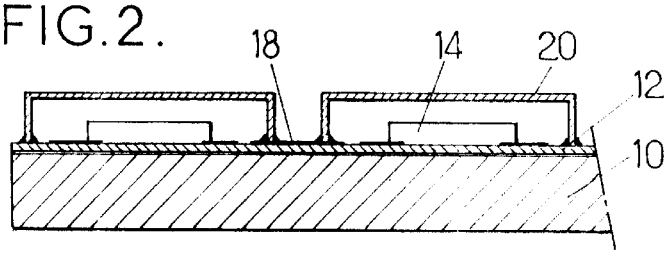
FIG. 2 is a detail view in section perpendicular to the plane of the substrate.

The module as shown comprises a substrate 10 made of a metal that is a good conductor of heat, e.g. pure or alloyed aluminum, carrying a printed circuit card 12. The thickness of the substrate can be a few millimeters to a few centimeters, depending on whether it is cooled on its face opposite from the printed circuit (e.g. by being carried on a cooling wall), or whether it contains a cooling circuit.

Power components 14 such as switching transistors are soldered to the printed circuit card 12. Only two such components are shown, and they are optionally accompanied by active components for control purposes (not shown) which carry only small control currents. The active control components receive and deliver signals which are carried by equipotential link tracks 16 which can be tracks that are printed in conventional manner, e.g. by silk-screen printing. Such control signals are also conveyed between the power components 14 and either the outside or control components.

The interconnection means carrying power currents comprise conductor track segments 18 that are as short as possible, interconnected by bridges of conductive metal 20. The segments 18 are made of copper and are advantageously of cross-section that is greater than that of the equipotential tracks. In the example shown in the figure, they are wider. They can also be thicker. The bridges 20 are generally made of copper, optionally tinned, and they are of a size that is selected so as to enable them to be placed astride the power components and their metal connection tabs 22. Some of these tabs are soldered to the segments 18 and others to soldering or brazing areas provided on the equipotential tracks.

The bridges are placed in such a manner that the gaps between them are as small as possible. In the example shown, the bridges are narrower than the active power components, but this is not essential. In practice, the bridges are generally constituted by fragments of copper sheet that is about 1 mm thick, and that is easy to bend into the shape of staples that are slightly taller than the components over which they are placed.

In general, it is possible to use a single type of bridge on any given circuit, thus avoiding errors. The size of the bridges is of the same order as the size of the power components, which facilitates installing them using the same automatic machine as is used for installing the components.

The module also has one or more connectors 24 for making connections with the outside, and these can be of conventional structure and they can be soldered to the segments.

A module of the kind described above is particularly suitable for use in an electromagnetic actuation system for engine valves, having a plurality of branches all of the same structure and thus having identical power components, thereby reducing the number of different components that need to be assembled together.

Mass production of the module begins by making the printed circuit cards 12 that carry the equipotential tracks and the conductive track segments of cross-section that is greater than that of the equipotential tracks, and in bonding them to one face of a metal substrate 10 by means of an adhesive that conducts heat. The locations that are to be connected and fixed to the tabs or contacts of the components and to the ends of the bridges are coated with solder or brazing paste, e.g. a lead-tin alloy or passivated copper.

The components and the bridges can be put into place using operations that are now well mastered and generally implemented on automatic machines. The components are initially put into place and retained by adhesion with brazing paste when that is used. Thereafter, the bridges are put into locations such that their ends contact the deposits of brazing paste and so as to interconnect the segments. Finally, the components and the bridges are fixed definitively by reflow soldering, e.g. by being passed through an oven having an air or a nitrogen atmosphere.

What is claimed is:

1. Power electronics module comprising:

a metal substrate having two faces a printed circuit car carried on one of the faces of the substrate;

a plurality on components, at least some of which are power components, mounted on the card; and electrical interconnection means between said components and between said components and external means;

wherein said interconnection means include a plurality of short segments of equipotential interconnection tracks on the printed circuit card for carrying power currents, and a plurality of conductive bridges of a shape enabling each of them to extend over a respective and beyond one of said power components and each of them mutually interconnecting two of said short segments of said equipotential interconnection tracks, that carry power currents.

2. Module according to claim 1, wherein said equipotential interconnection tracks printed on the printed circuit card further include equipotential tracks carrying control currents and wherein said short segments have a cross-sectional area greater than a cross-sectional area of said equipotential tracks carrying control currents.

3. Module according to claim 1, wherein said bridges have ends thereof soldered onto the card.

4. Module according to claim 1, wherein the printed circuit card is single layer.

5. Module according to claim 1, wherein the printed circuit card is multi-layer with an insulated face, bonded to the substrate.

6. Module according to claim 1, wherein said substrate is carried by a cooled wall or contains a circuit for a cooling fluid.

7. Power electronics module comprising:

a metal substrate having two faces printed circuit card carried on one of the faces of the substrate;

a plurality on components, at least some of which are power components, mounted on the card; and electrical interconnection means between said components and between said components and external means;

wherein said interconnection means include a plurality of equipotential interconnection tracks each having short segments for carrying power currents, and a plurality of staple-shaped conductive bridges each of them having a length and height sufficient to straddle a respective one of said power components without contact with said respective one of said power components and each of them mutually interconnecting two of said short segments of those of said equipotential interconnection tracks that carry power currents.

8. Power electronics module according to claim 7, wherein all of the bridges have the same size.

9. Power electronics module according to claim 7, wherein most of the bridges have the same size.

* * * * *

UNITED STATES PATENT AND TRADEMARK OFFICE
CERTIFICATE OF CORRECTION

PATENT NO. : 6,452,808 B2
DATED : September 17, 2002
INVENTOR(S) : Jean Hoche

It is certified that error appears in the above-identified patent and that said Letters Patent is hereby corrected as shown below:

Column 3,
Line 45, please delete "car" and replace with -- card --
Line 47, please delete "on" and replace with -- of --

Column 4,
Line 28, please insert -- a -- before "printed"
Line 31, please delete "on" and replace with -- of --

Signed and Sealed this

Eleventh Day of February, 2003

JAMES E. ROGAN
*Director of the United States Patent and Trademark Office*